United States Patent [19]
Lai

[11] Patent Number: 5,658,160
[45] Date of Patent: Aug. 19, 1997

[54] ZERO EXTRACTION FORCE SOCKET

[76] Inventor: Kuang-Chih Lai, No. 2, Lane 10, Sheng-Li Street, Tu-Cheng City, Taipei Hsien, Taiwan

[21] Appl. No.: 552,931

[22] Filed: Nov. 3, 1995

[51] Int. Cl.[6] .................................................. H01R 4/50
[52] U.S. Cl. .................................. 439/342; 439/259
[58] Field of Search ............................ 439/259–265, 439/342, 266–268

[56] References Cited

U.S. PATENT DOCUMENTS

| | | | |
|---|---|---|---|
| 4,420,205 | 12/1983 | Kirkman | 439/342 |
| 5,013,256 | 5/1991 | Matsuoka et al. | 439/342 |
| 5,057,031 | 10/1991 | Sinclair | 439/342 |

*Primary Examiner*—Hien Vu
*Attorney, Agent, or Firm*—Morton J. Rosenberg; David I. Klein

[57] ABSTRACT

A zero extraction force socket including an insulative housing formed with multiple insertion holes for conductive contacts to insert thereinto. Multiple insertion pins of an integrated circuit are inserted into the insertion holes to contact with the conductive contacts. The housing is further formed with a fulcrum dent disposed on or near one edge of the housing for a pushing piece to insert thereinto. The fulcrum dent serves as a leverage fulcrum, enabling the pushing piece to directly push/lever an edge of the integrated circuit and shift the integrated circuit on an insertion face of the housing with the insertion pins of the integrated circuit moving from a contacting position where the insertion pins contact with the conductive contacts to a loosening position where the insertion pins loosen from the conductive contacts. The conductive contact includes a U-shaped base section, at least two resilient sections downward extending from the base section, a main stem section connected with the base section and an insertion leg section downward extending from the main stem section. The base section is attached to a lateral wall of the insertion hole, permitting the insertion pin of the integrated circuit to be smoothly slided over the base section and tightly clamped in the resilient sections.

10 Claims, 17 Drawing Sheets

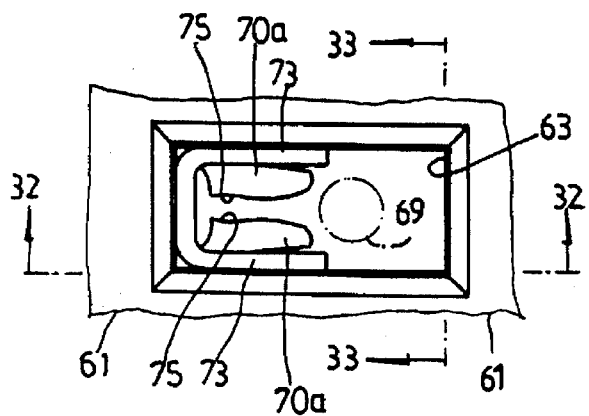
Fig. 31
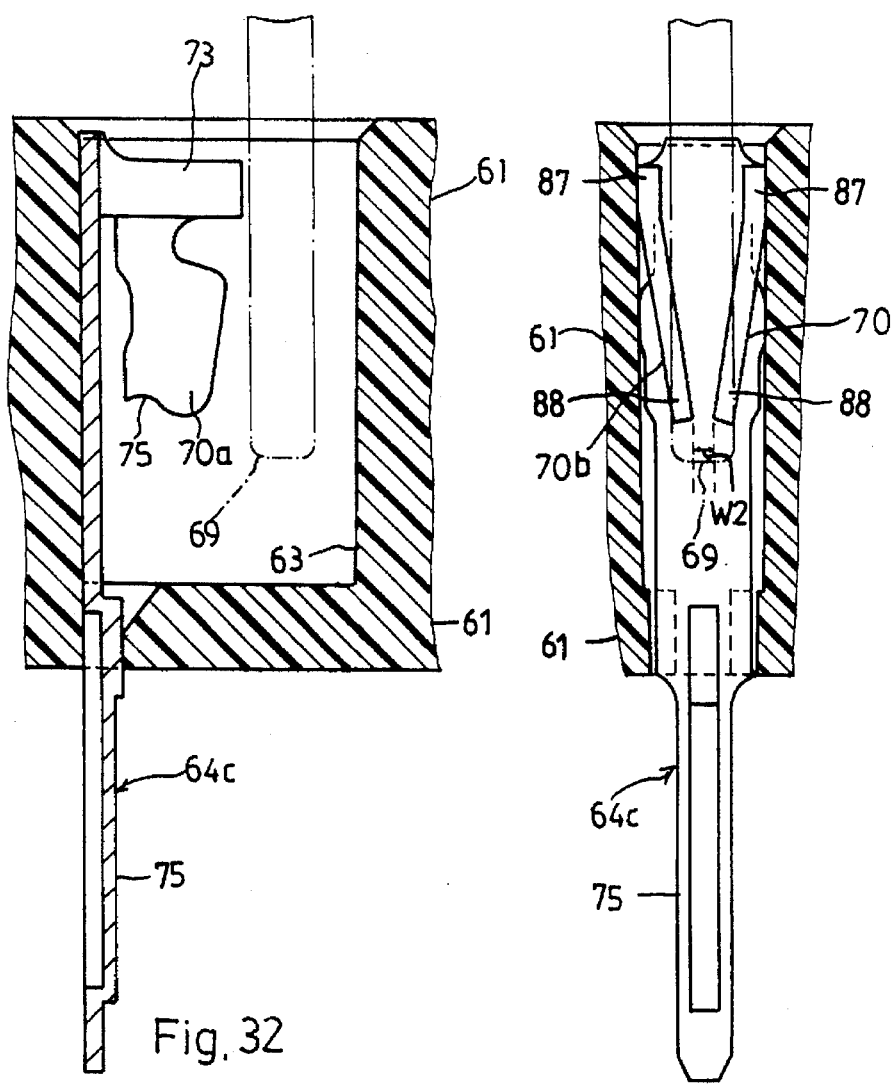
Fig. 32
Fig. 33

ZERO EXTRACTION FORCE SOCKET

BACKGROUND OF THE INVENTION

The present invention relates to a zero extraction force socket in which the sliding member and operation arm of the conventional zero insertion/extraction force socket are eliminated so as to minimize the socket.

It is known that a personal computer is equipped with a CPU which is inserted in a socket in the computer. For the purpose of progression, the CPU is always replaced by an advanced one after a period of use. At this time, the CPU must be extracted from the socket and the advanced one must be inserted into the socket instead. In order to facilitate the insertion/extraction operation, a zero insertion/extraction force socket is developed. A user can easily insert the CPU into the socket or extract the CPU therefrom without consuming much strength.

As shown in FIGS. 41 and 42, such zero insertion/extraction force socket includes a housing 55 and a sliding member 56 slidable on the housing 55. The housing 55 is formed with an array of insertion holes (not shown) and multiple conductive contacts 51 are inserted in the insertion holes. In addition, an L-shaped operation arm 57 is pivotally disposed on one side of the housing 55. By means of pivoting the operation arm 57, the sliding member 56 is forced to slide in a direction of arrow 58 so as to shift an integrated circuit (CPU) inserted into the socket. Therefore, the terminals or insertion pins of the integrated-circuit are forced to contact with the conductive contacts or loosen therefrom. Accordingly, the purpose of zero insertion/extraction force is achieved.

Because such zero insertion/extraction force socket includes the sliding member 56 and the operation arm 57, the space occupied by the socket is considerably large. This fails to meet the commercial requirement of minimization of any electronic part. Therefore, it is necessary to simplify and minimize the conventional zero insertion/extraction force socket.

SUMMARY OF THE INVENTION

It is therefore a primary object of the present invention to provide a zero extraction force socket which has simplified structure and minimized volume and is adapted to be mounted on a printed circuit board. The socket includes an insulative housing having: multiple insertion holes for conductive contacts to insert thereinto, multiple insertion pins of an integrated circuit being inserted into the insertion holes to contact with the conductive contacts; and a fulcrum dent disposed on or near one edge of the housing for a pushing piece to insert thereinto, the fulcrum dent serving as a leverage fulcrum, enabling the pushing piece to directly push/lever an edge of the integrated circuit and shift the integrated circuit in an insertion face of the housing with the insertion pins of the integrated circuit moving from a contacting position where the insertion pins contact with the conductive contacts to a loosening position where the insertion pins loosen from the conductive contacts.

It is a further object of the present invention to provide the above socket further including a pushing member disposed in the fulcrum dent and having an insertion section, a resilient section and a pushing section. The insertion section is inserted in the fulcrum dent. The resilient section integrally extends from the insertion section to form a fulcrum concave for contacting with the pushing piece and providing a leverage fulcrum therefor. The pushing section is integrally connected with an end of the resilient section, having a pushing face and a pushed face. The pushing face serves to push the edge of the integrated circuit, while the pushed face contacts with the pushing piece inserted in the fulcrum dent and is pushed by the pushing piece.

It is still a further object of the present invention to provide the above socket further including a metal protective member inserted in the fulcrum dent to form a hard and anti-abrasion surface on a surface of the fulcrum dent.

It is still a further object of the present invention to provide the above socket wherein the conductive contact includes a U-shaped base section, at least two resilient sections downward extending from the base section, a main stem section connected with the base section and an insertion leg section downward extending from the main stem section. The base section is attached to a lateral wall of the insertion hole with the resilient sections downward extending from lower edges of two sides of the base section, so that the insertion pin of the integrated circuit can be smoothly slided over the base section and tightly clamped in the resilient sections.

It is still a further object of the present invention to provide the above socket wherein the space between lower edges of two resilient sections is less than the space between upper edges thereof and on lower edge of the two resilient section are formed clamping notches dented upward. The space between the two clamping notches of the resilient sections is larger than the space between the lower edges of the resilient sections, whereby the insertion pin of the integrated circuit is more firmly clamped between the clamping notches and prevented from slipping outward.

It is still a further object of the present invention to provide the above socket wherein at least one of the resilient sections has a curved concave face for more firmly clamp the insertion pin of the integrated circuit.

It is still a further object of the present invention to provide the above socket wherein each of the resilient sections of the conductive contact is further cut into at least two resilient sections. Two of the four resilient sections are located at an opening position of the U-shaped base section and serve to clamp and stop the insertion pin from slipping off from the conductive contact and enhance the contacting effect.

The present invention can be best understood through the following description and accompanying drawing, wherein:

BRIEF DESCRIPTION OF THE DRAWINGS

FIG. 31 is a top view of the second embodiment of the conductive contact, showing that the insertion pin of the integrated circuit is slided out of the contacting position;

FIG. 32 is a sectional view taken along line 32—32 of FIG. 31;

FIG. 33 is a sectional view taken along line 33—33 of FIG. 31;

DETAILED DESCRIPTION OF THE PREFERRED EMBODIMENTS

Figure 1:
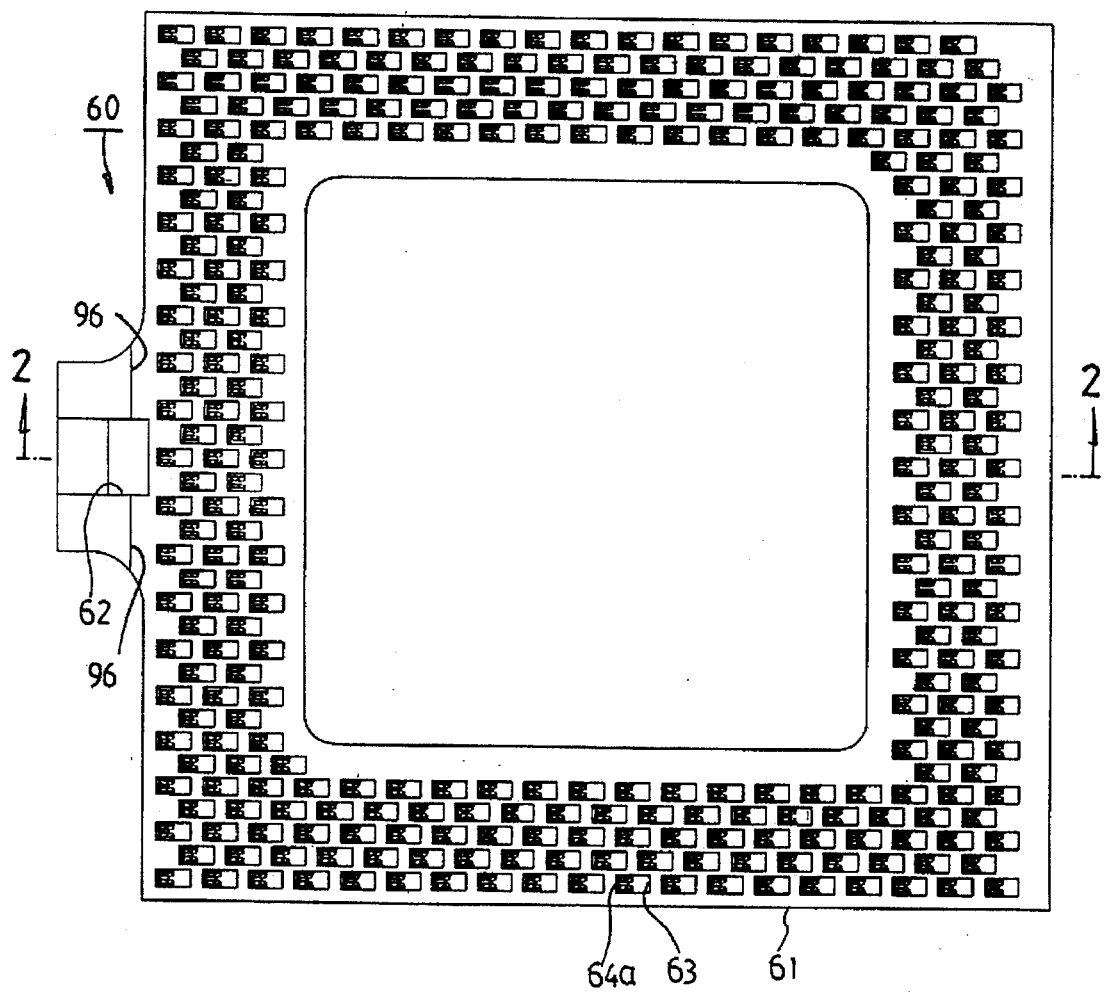
FIG. 1 is a top view of a first embodiment of the zero extraction force socket of the present invention.
Figure 2:
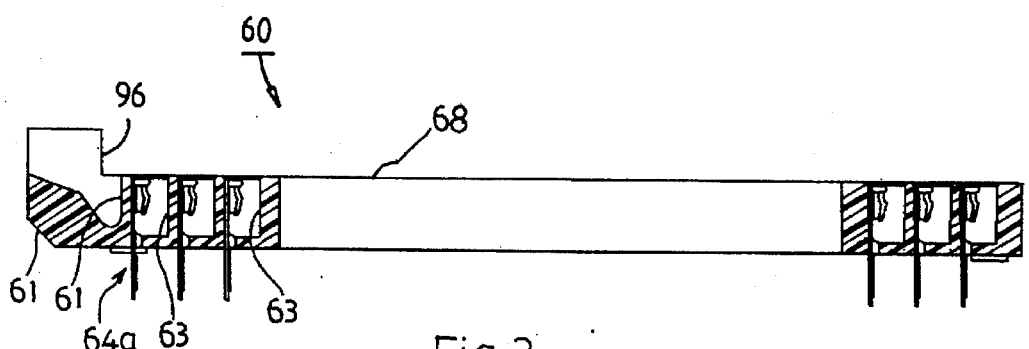
FIG. 2 is a sectional view taken along line 2—2 of FIG. 1.

Please refer to FIGS. 1 to 40. The zero extraction force socket 60 of the present invention includes an insulative housing 61 and a fulcrum dent 62. The housing 61 is formed with multiple insertion holes 63 for conductive contacts 64a, 64b, 64c (as shown in FIGS. 17 to 23, 28 to 40) to insert therein. The fulcrum dent 62 is disposed on or near one edge of the housing 61, so that a pushing piece 66 (such as a screwdriver or other flat elongated piece) can be inserted into the fulcrum dent 62 to push/lever an integrated circuit 67 with the fulcrum dent 62 serving as a leverage fulcrum.

Alternatively, as shown in FIGS. 13 to 16, an assistant pushing member 65 is inserted in the fulcrum dent 62, whereby the pushing piece 66 first pushes the assistant pushing member 65 and then the assistant pushing member 65 pushes the integrated circuit 67 inserted in the housing 61. Accordingly, the integrated circuit 67 is shifted on an insertion face 68 of the housing 61 with the insertion pins 69 of the integrated circuit 67 moving from a contacting position where the insertion pins 69 contact with the conductive contacts 64a, 64b to a loosening position where the insertion pins 69 loosen from the conductive contacts 64a, 64b. Alternatively, as shown in FIGS. 24 to 27, a metal protective member 80 is further inserted in the fulcrum dent 62 to form a hard and anti-abrasion surface on the surface of the fulcrum dent 62 for resisting against the scraping of the pushing piece 66 and preventing the plastic surface of the fulcrum dent 62 from being scraped by the pushing piece 66.

Referring to FIGS. 13 to 16, the pushing member 65 is disposed in the fulcrum dent 62, having an insertion section 90, a resilient section 91 and a pushing section 92. The insertion section 90 is inserted in the fulcrum dent 62 and the resilient section 91 integrally extends from the insertion section 90 to form a fulcrum concave 93 for contacting with the pushing piece 66 and providing a leverage fulcrum therefor. The pushing section 92 is integrally connected with an end of the resilient section 91, having a pushing face 94 and a pushed face 95. The pushing face 94 serves to push an edge of the integrated circuit 67, while the pushed face 95 contacts with the pushing piece 66 inserted in the fulcrum dent 62 and is pushed by the pushing piece 66.

The pushing member 65 is made of metal material and formed with a U-shaped or V-Shaped resilient structure. The pushing piece 66 pushes the pushing member 65 and the pushing member 65 in turn pushes the integrated circuit 67. Therefore, the pushing piece 66 is prevented from colliding and damaging the integrated circuit 67 or the cooling fan disposed thereon.

Referring to FIGS. 1 to 10, 13 to 16 and 24 to 27, the fulcrum dent 62 and the pushing member 65 are disposed only on one side of the housing 61 in order to shift the insertion pins of the integrated circuit from the contacting position to the loosening position.

Figure 3:
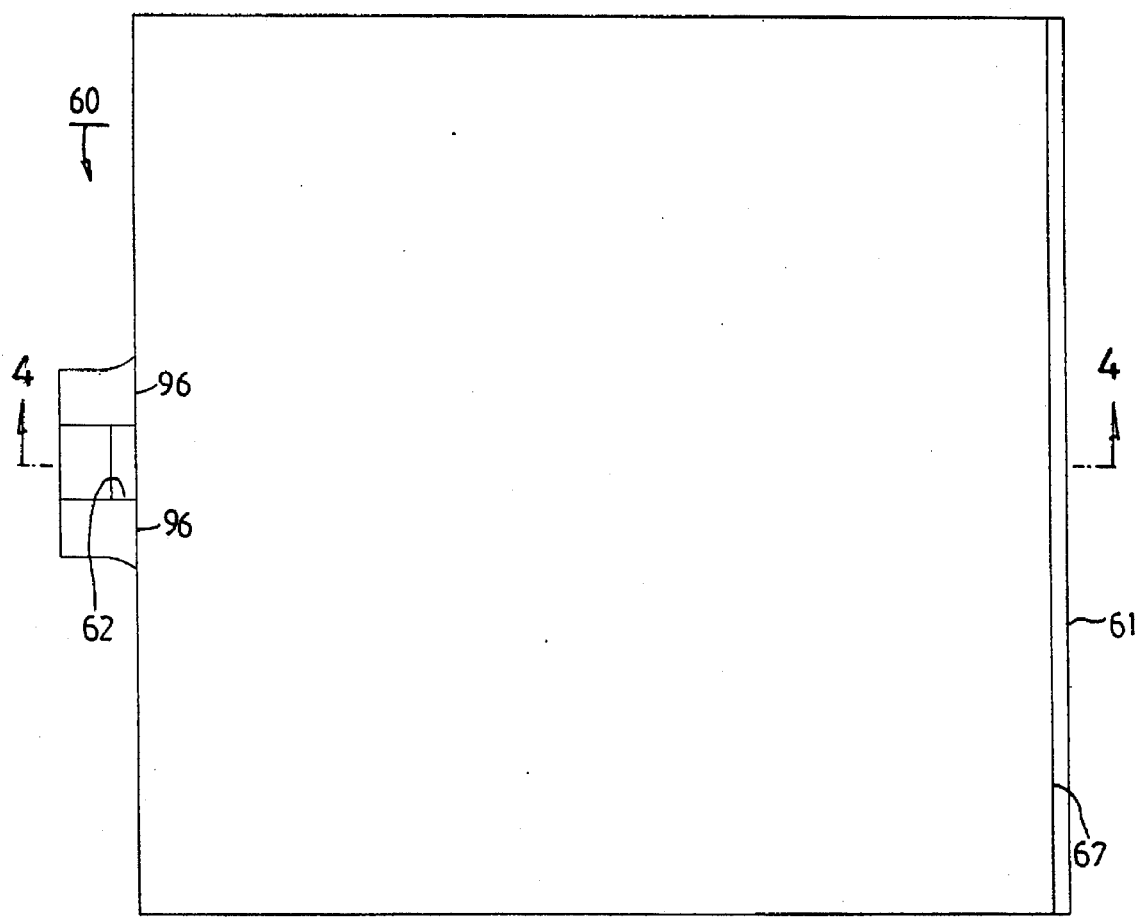
FIG. 3 is a top view showing that the insertion pins of the integrated circuit are abut to be from an upper side of the conductive contacts inserted into the insertion holes of the socket of FIG. 1.
Figure 4:
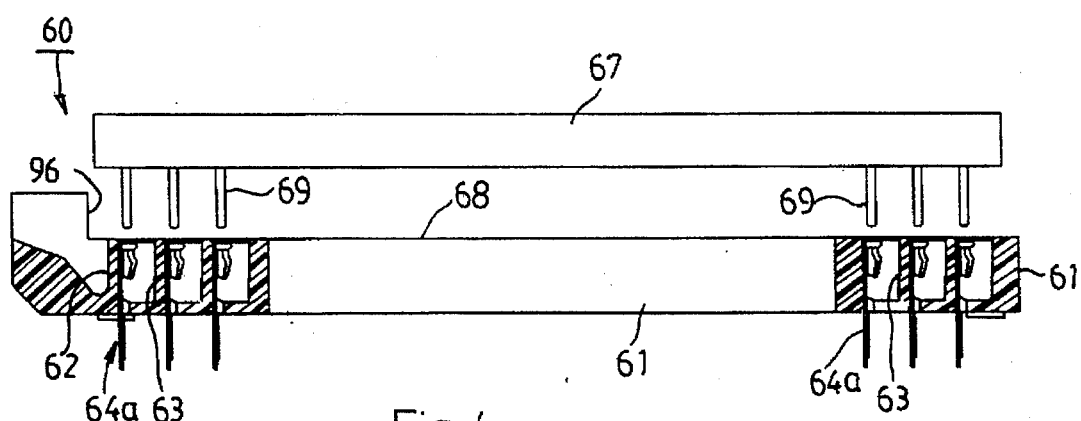
FIG. 4 is a sectional view taken along line 4—4 of FIG. 3.
Figure 5:
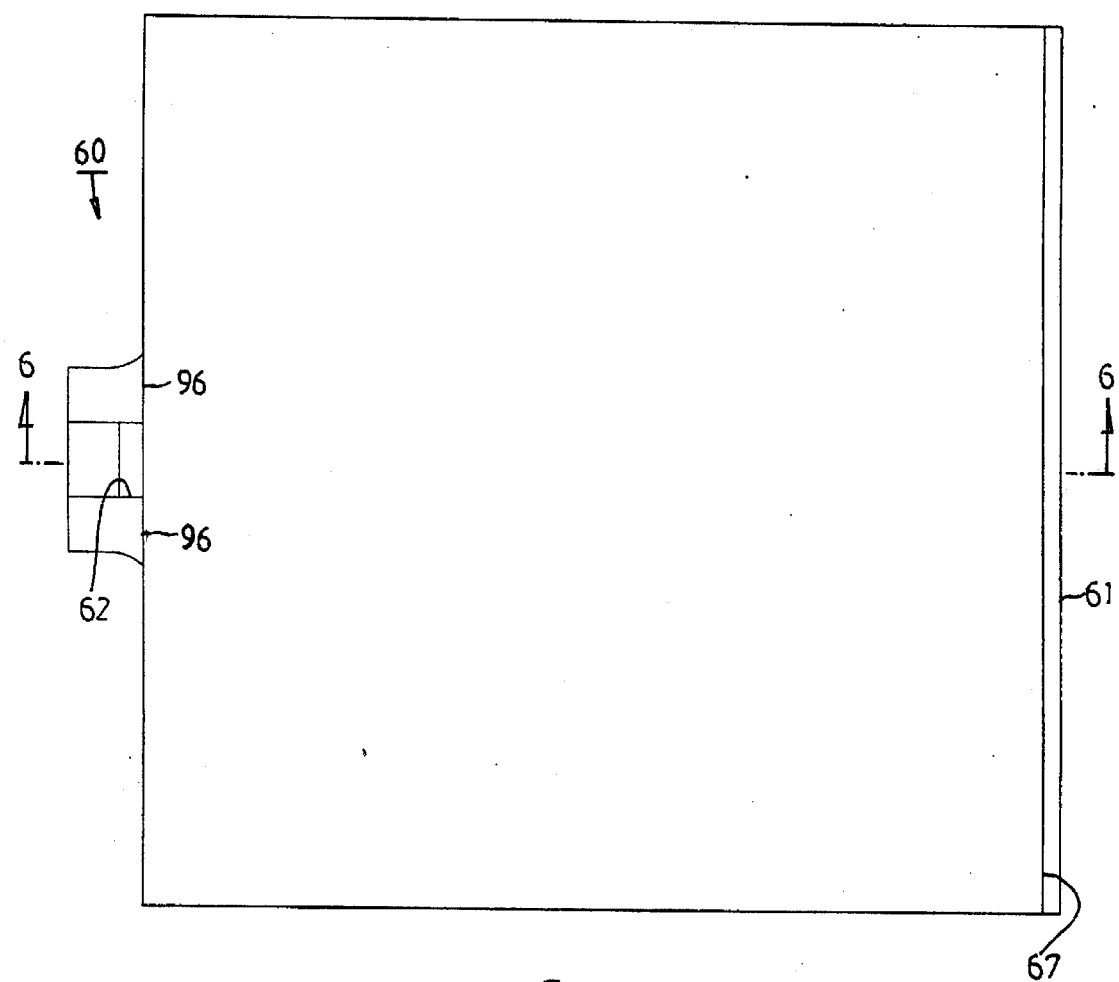
FIG. 5 is a top view according to FIG. 3, showing that the integrated circuit has been inserted into the socket.
Figure 6:
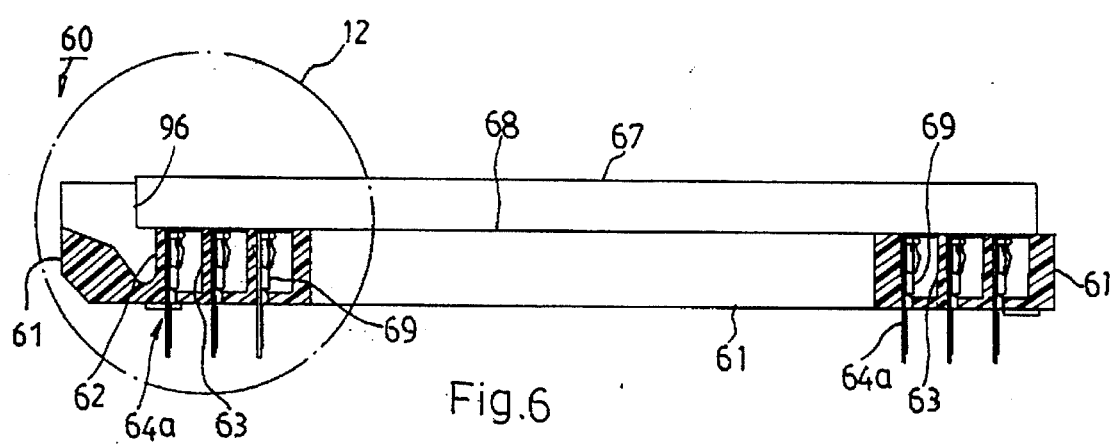
FIG. 6 is a sectional view taken along line 6—6 of FIG. 5.
Figure 7:
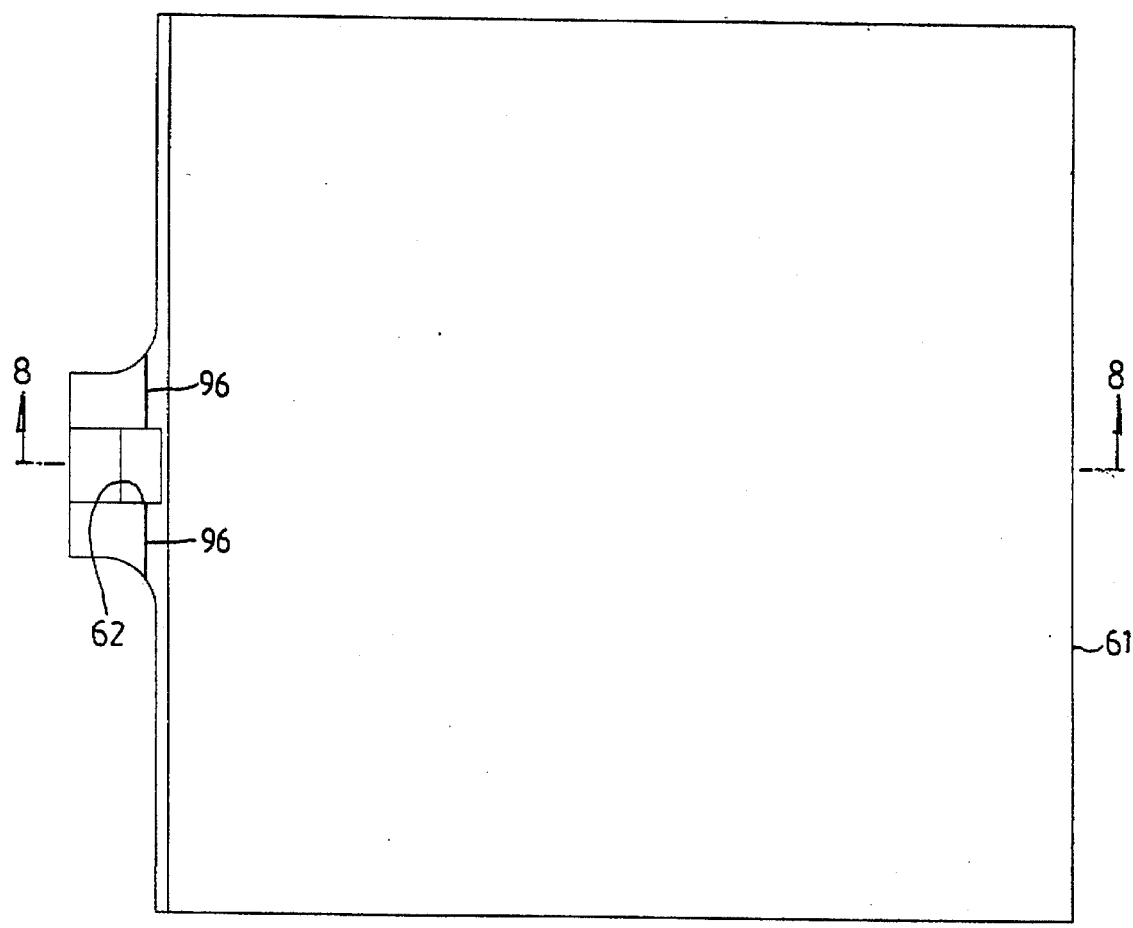
FIG. 7 is a top view showing that the insertion pins of the integrated circuit are shifted by a pushing piece such as a screwdriver from a contacting position to a loosening position.
Figure 8:
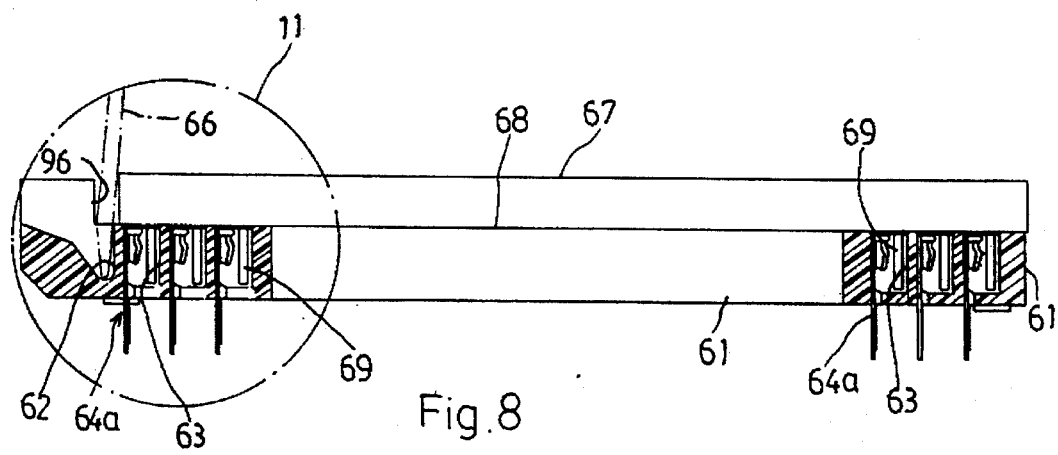
FIG. 8 is a sectional view taken along line 8—8 of FIG. 7.
Figure 9:
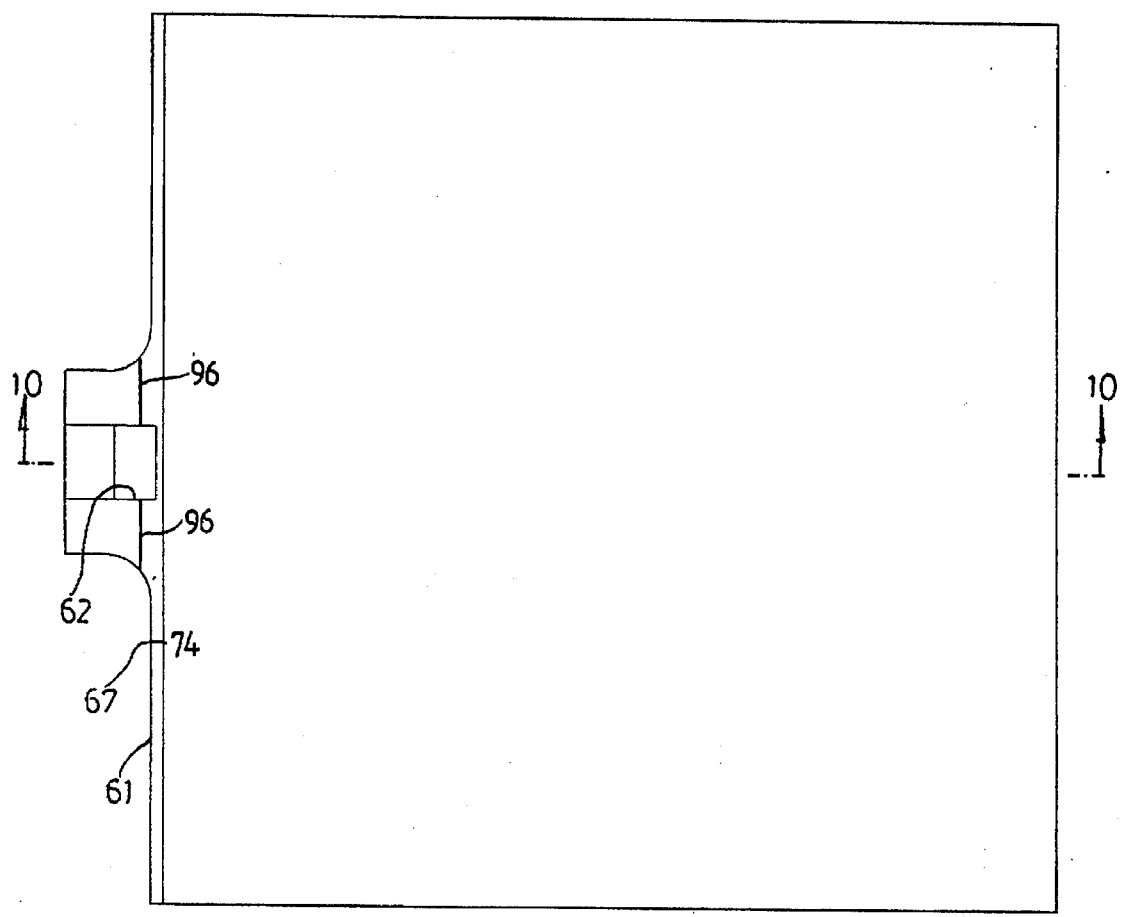
FIG. 9 is a top view according to FIG. 7, showing that the insertion pins of the integrated circuit are easily extracted from the socket after shifted to the loosening position.
Figure 10:
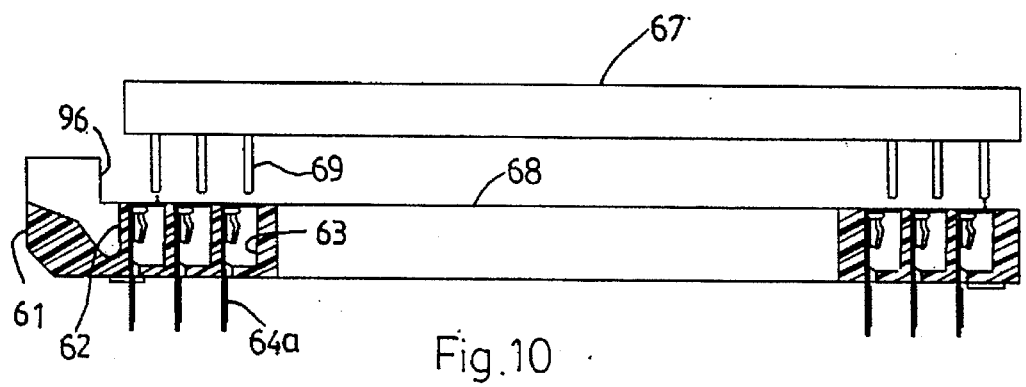
FIG. 10 is a sectional view taken along line 10—10 of FIG. 9.
Figure 11:
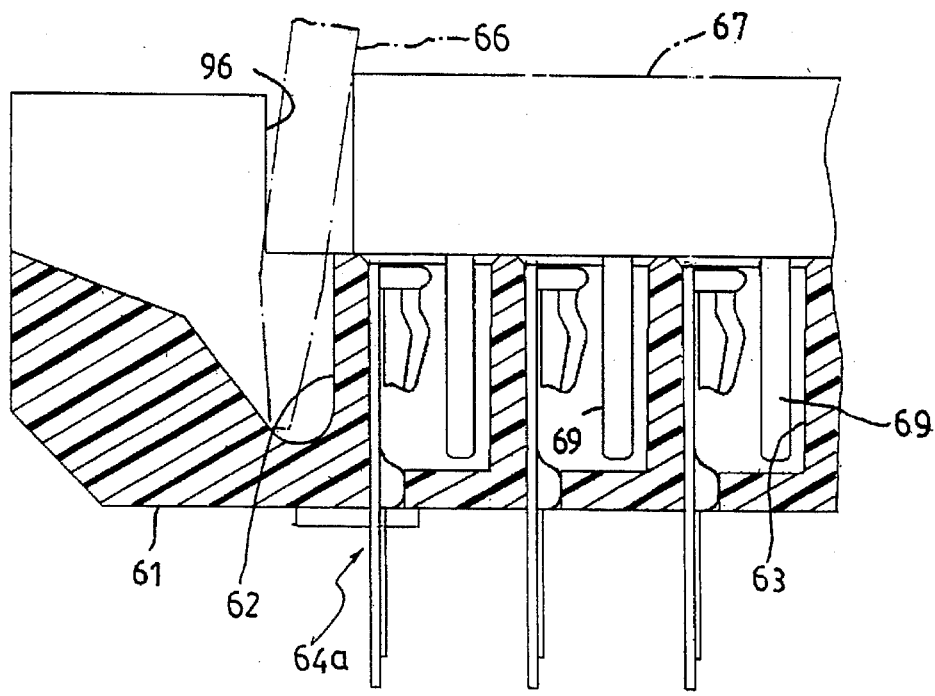
FIG. 11 is a partially enlarged view of the area 11 encircled by phantom line of FIG. 8.
Figure 12:
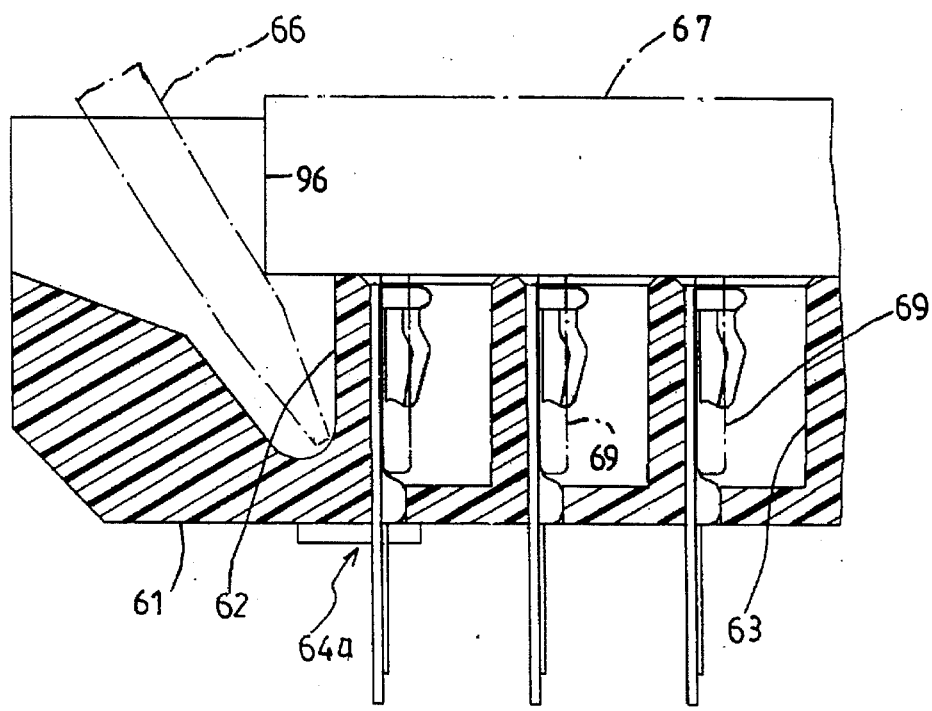
FIG. 12 is a partially enlarged view of the area 12 encircled by phantom line of FIG. 6.
Figure 13:
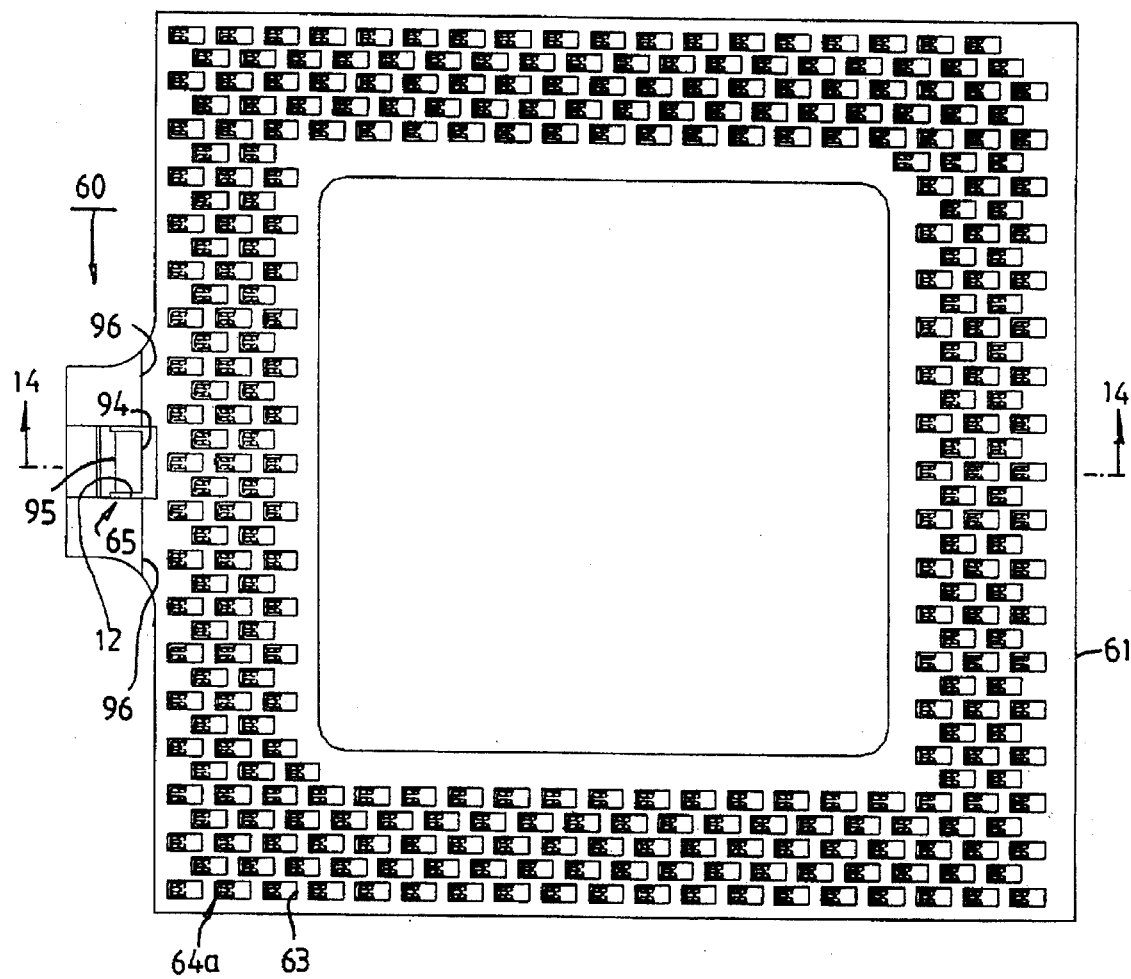
FIG. 13 is a top view of a second embodiment of the zero extraction force socket of the present invention.
Figure 14:
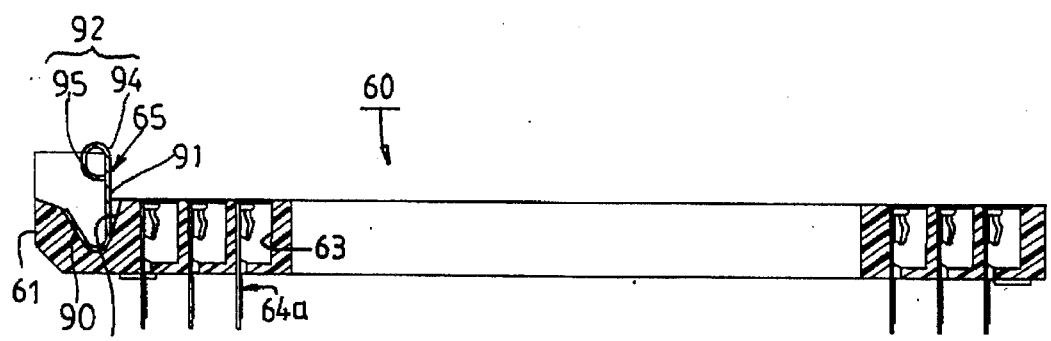
FIG. 14 is a sectional view taken along line 14—14 of FIG. 13.
Figure 15:
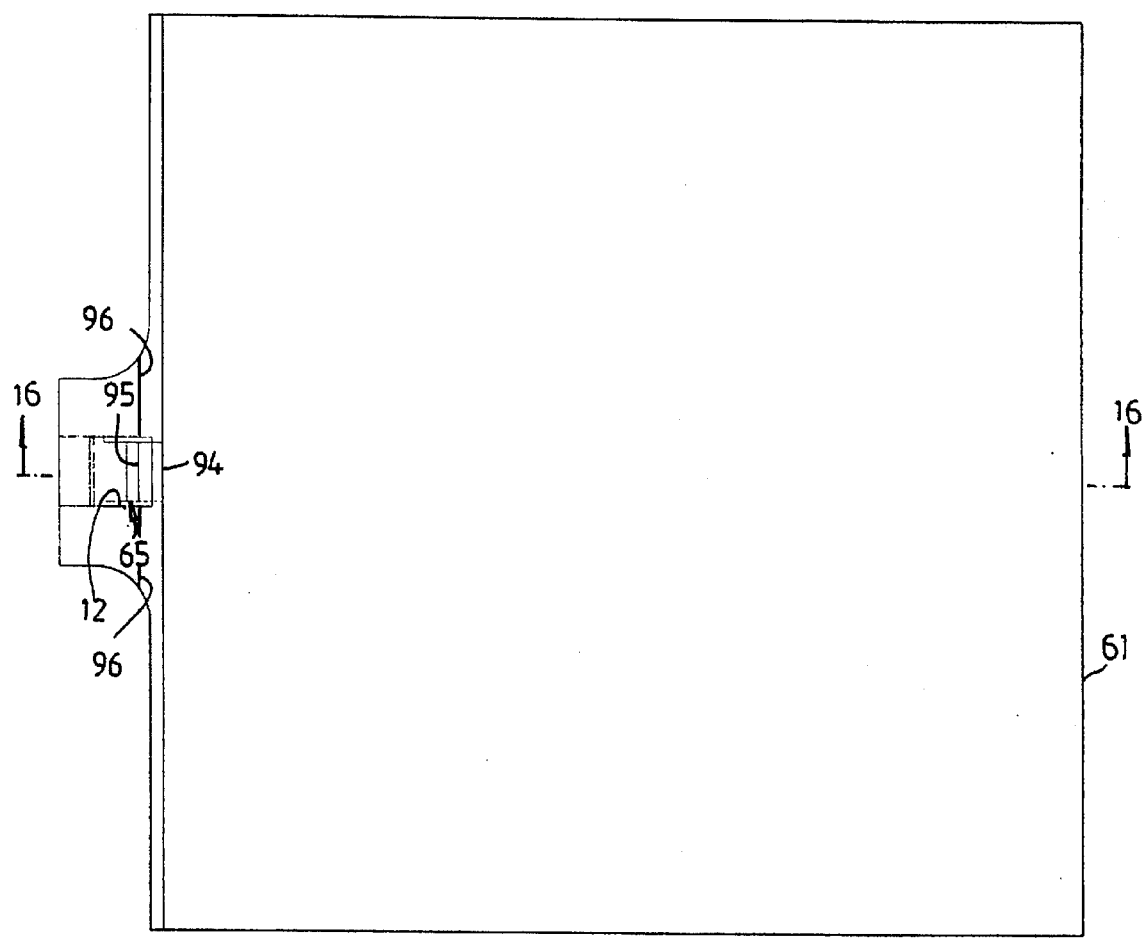
FIG. 15 is a top view showing that the insertion pins of the integrated circuit are shifted by the pushing member from a contacting position to a loosening position.
Figure 16:
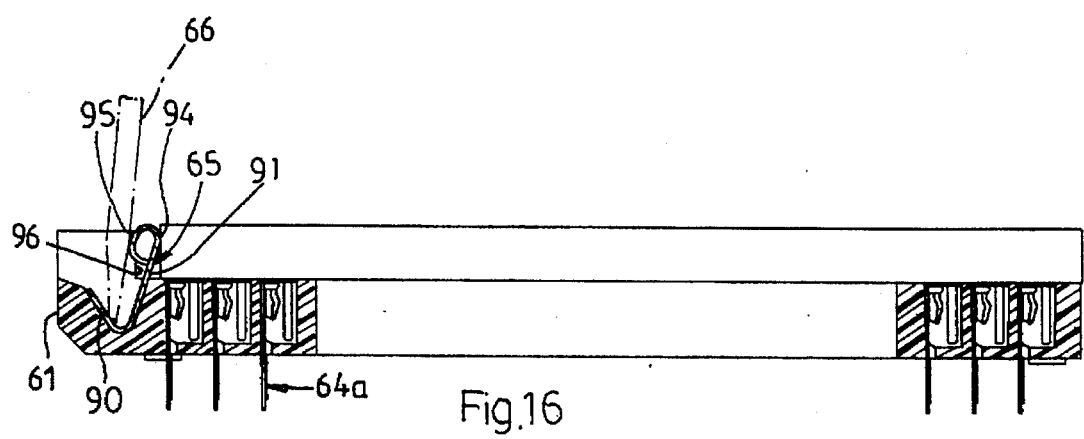
FIG. 16 is a sectional view taken along line 16—16 of FIG. 15.
Figure 17:
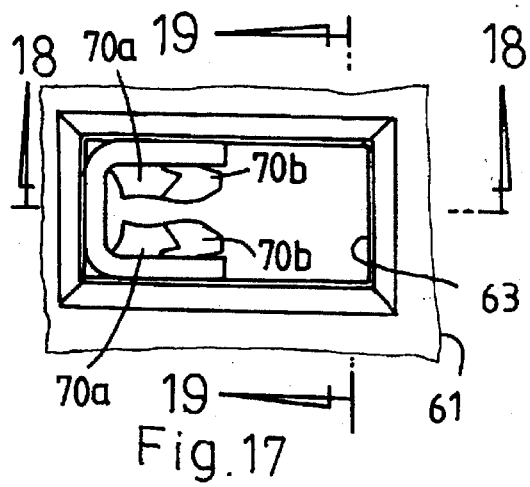
FIG. 17 is a top view of a first embodiment of the conductive contact of the present invention, wherein the conductive contact is not inserted into the insertion hole of the housing.
Figures 18, 19:
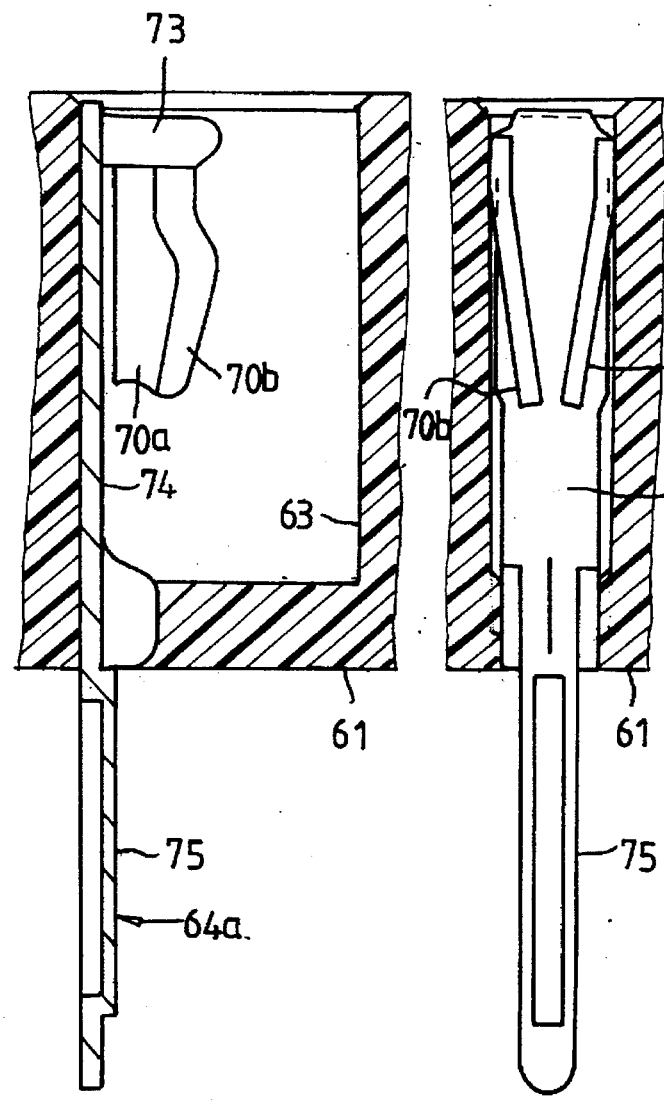
FIG. 18 is a sectional view taken along line 18—18 of FIG. 17.
FIG. 19 is a sectional view taken along line 19—19 of FIG. 17.
Figure 20:
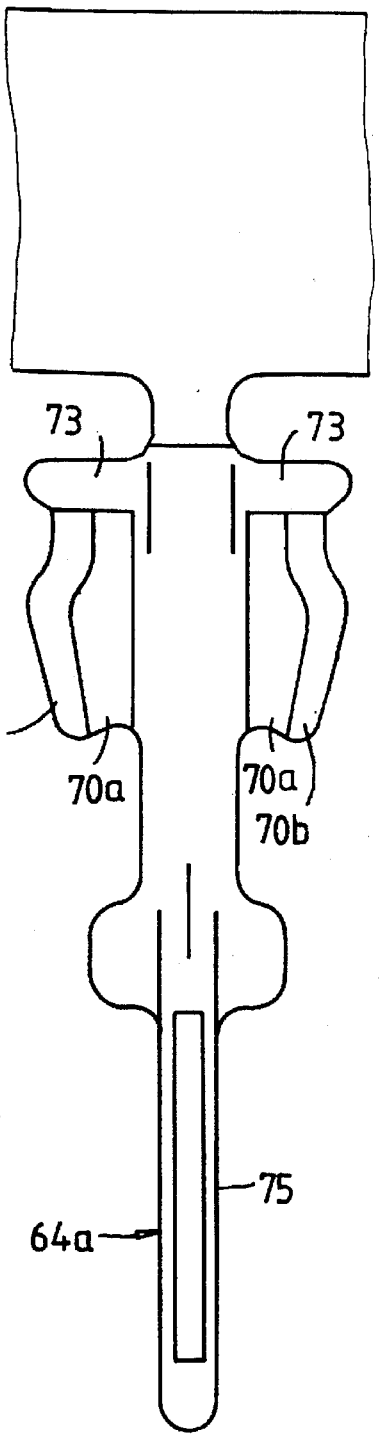
FIG. 20 is a right stretched view of the conductive contact of FIG. 19.
Figure 21:
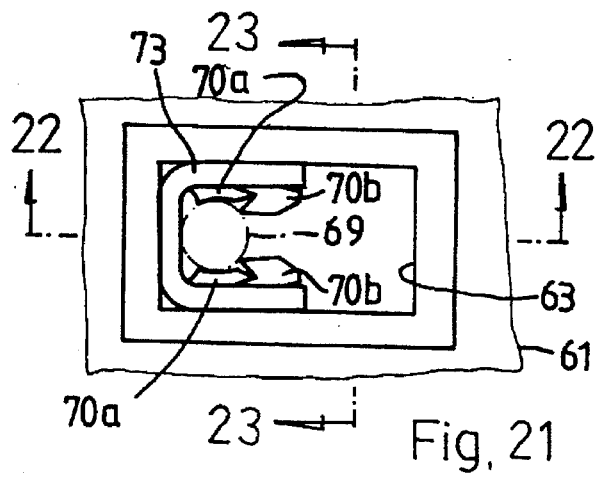
FIG. 21 is a top view showing that the insertion pin of the integrated circuit is inserted into the conductive contact of FIG. 17.
Figures 22, 23:
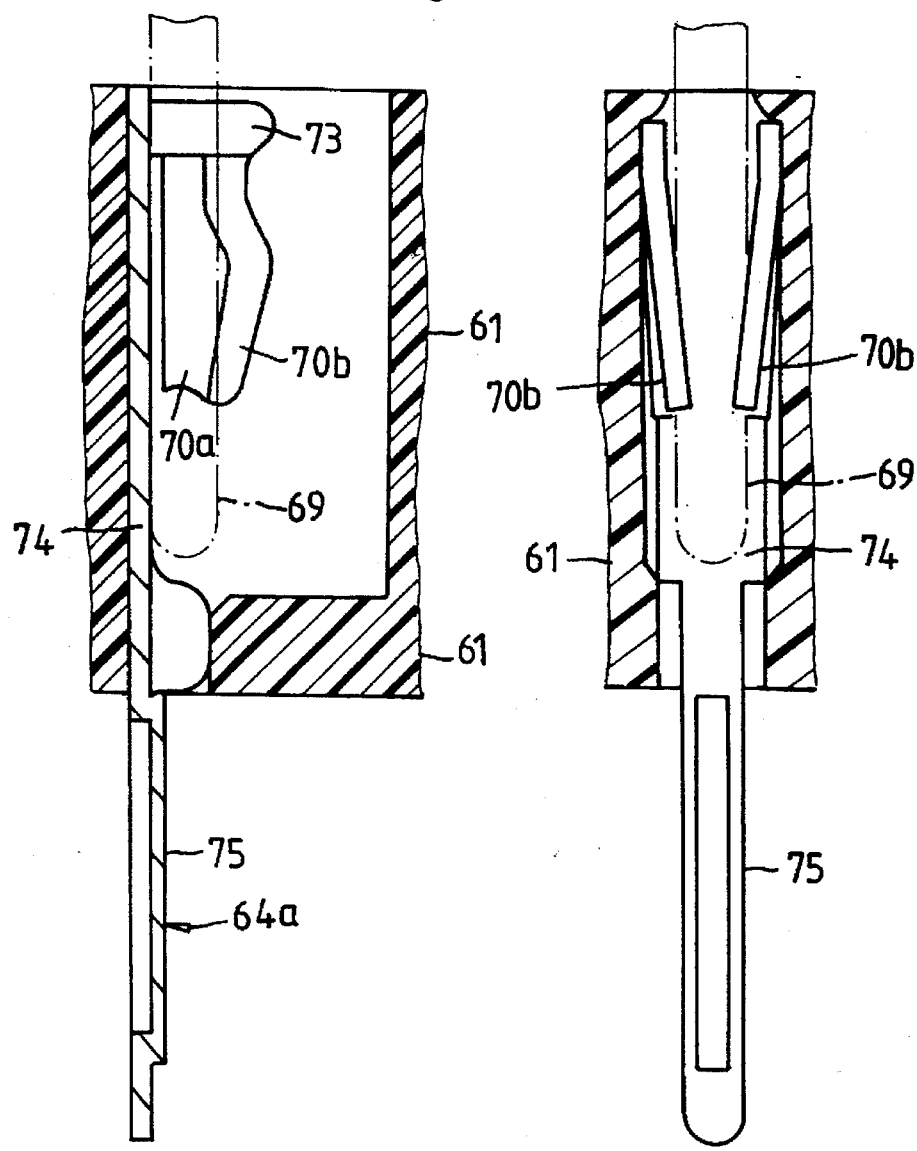
FIG. 22 is a sectional view taken along line 22—22 of FIG. 21.
FIG. 23 is a sectional view taken along line 23—23 of FIG. 21.
Figure 24:
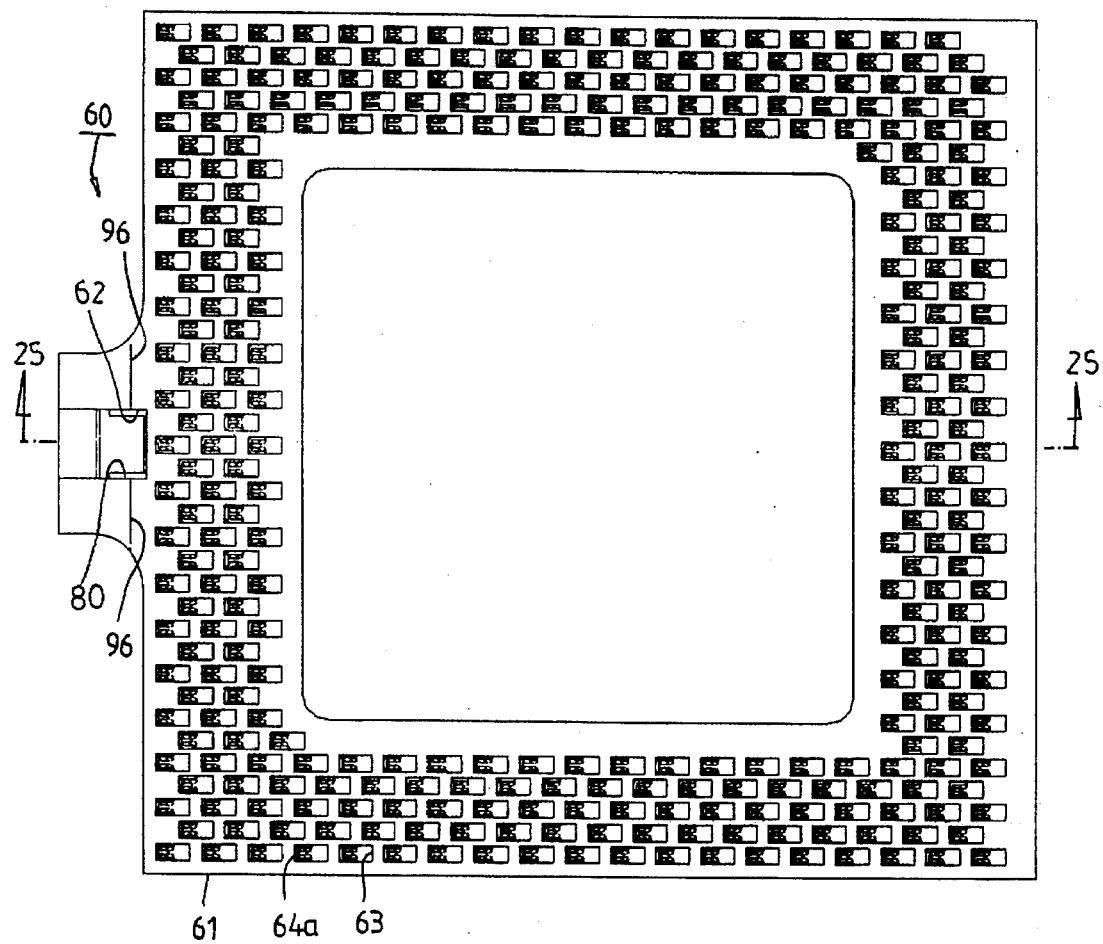
FIG. 24 is a top view of a third embodiment of the zero extraction force socket of present invention.
Figure 25:
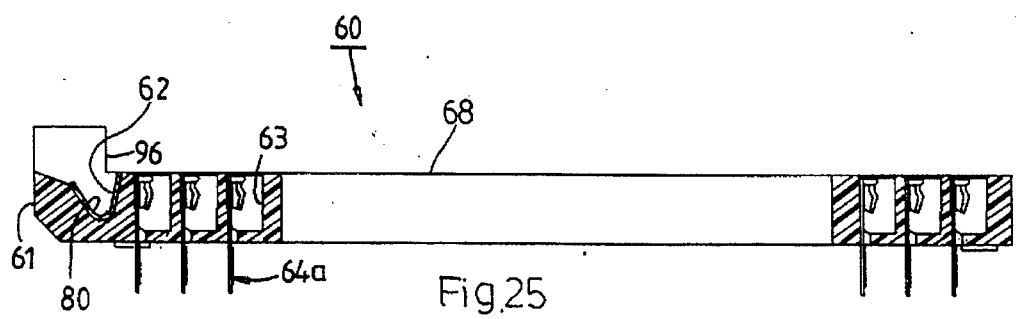
FIG. 25 is a sectional view taken along line 25—25 of FIG. 24.
Figure 26:
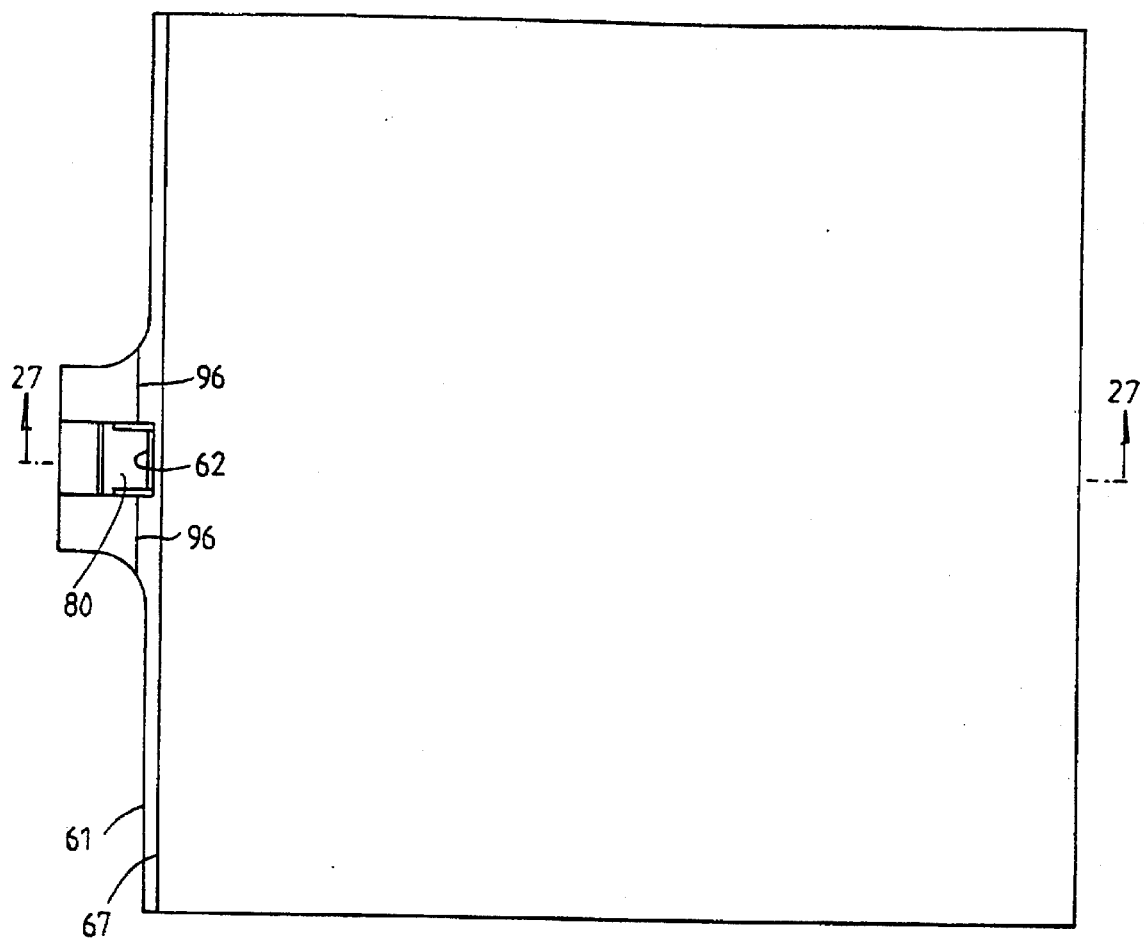
FIG. 26 is a top view according to FIG. 24, showing that the insertion pins of the integrated circuit are shifted by a pushing piece such as a screwdriver from a contacting position to a loosening position.
Figure 27:
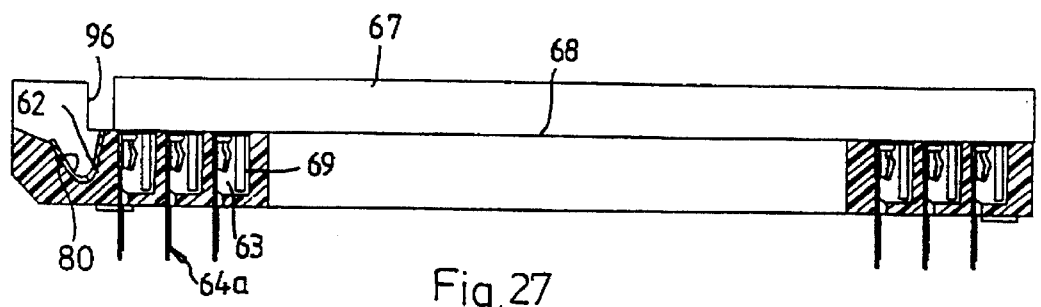
FIG. 27 is a sectional view taken along line 27—27 of FIG. 26.
Figure 28:
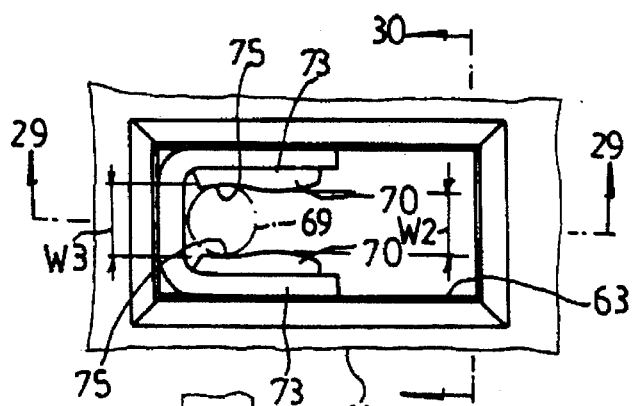
FIG. 28 is a top view of the second embodiment of the conductive contact, showing that the insertion pin of the integrated circuit is slided into the contacting position.
Figure 29:
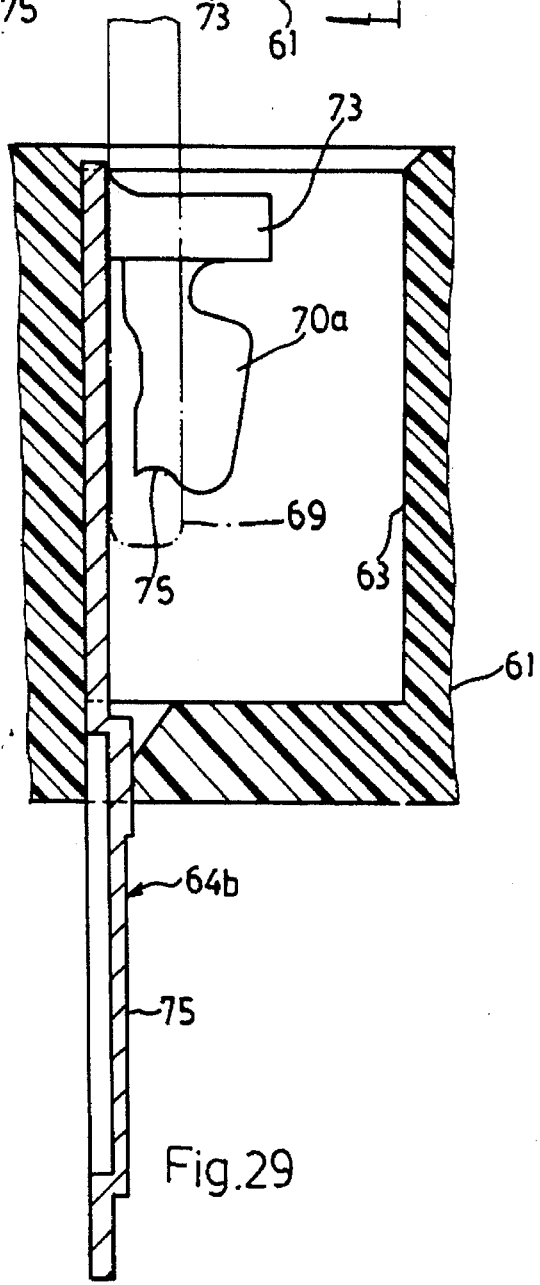
FIG. 29 is a sectional view taken along line 29—29 of FIG. 28.
Figure 30:
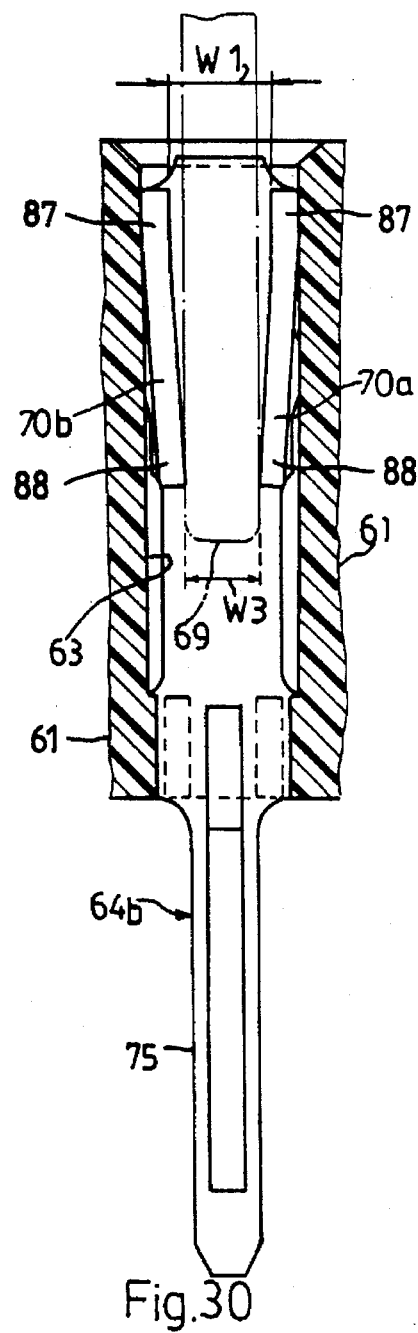
FIG. 30 is a sectional view taken along line 30—30 of FIG. 28.
Figure 34:
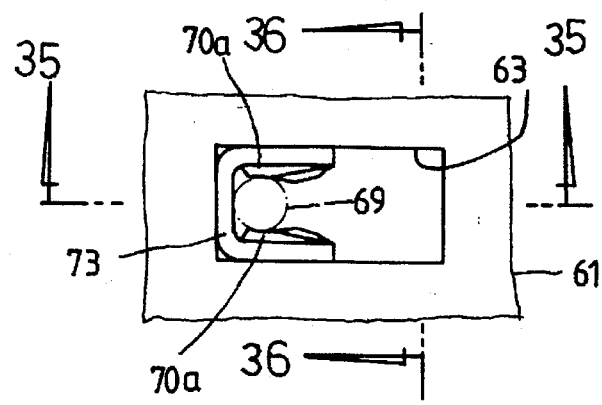
FIG. 34 is a top view of the third embodiment of the conductive contact, showing that the insertion pin of the integrated circuit is slided into the contacting position.
Figures 35, 36:
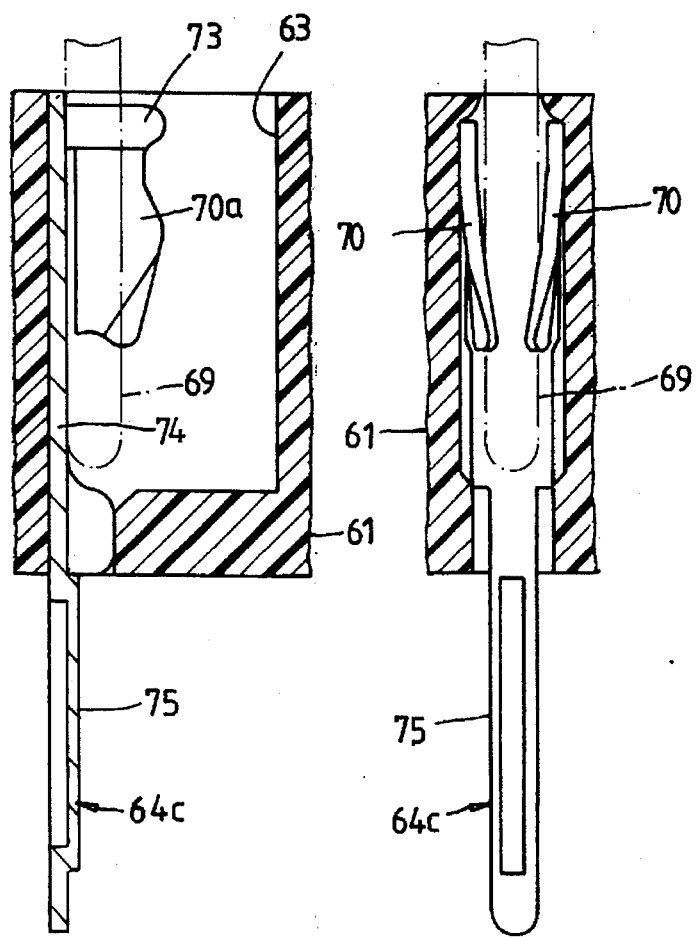
FIG. 35 is a sectional view taken along line 35—35 of FIG. 34.
FIG. 36 is a sectional view taken along line 36—36 of FIG. 34.
Figure 37:
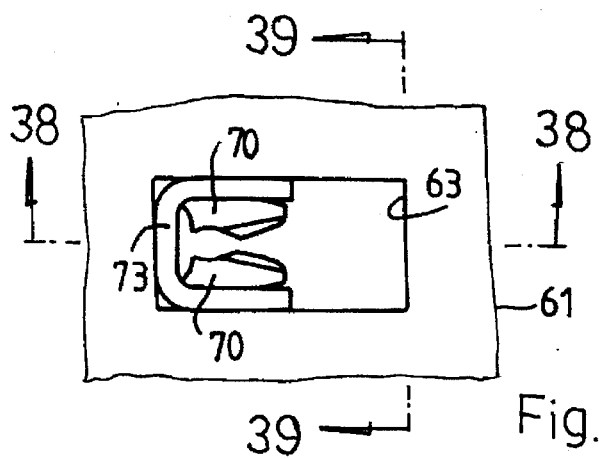
FIG. 37 is a top view of the third embodiment of the conductive contact, showing that the insertion pin of the integrated circuit is slided out of the contacting position.
Figures 38, 39, 40:
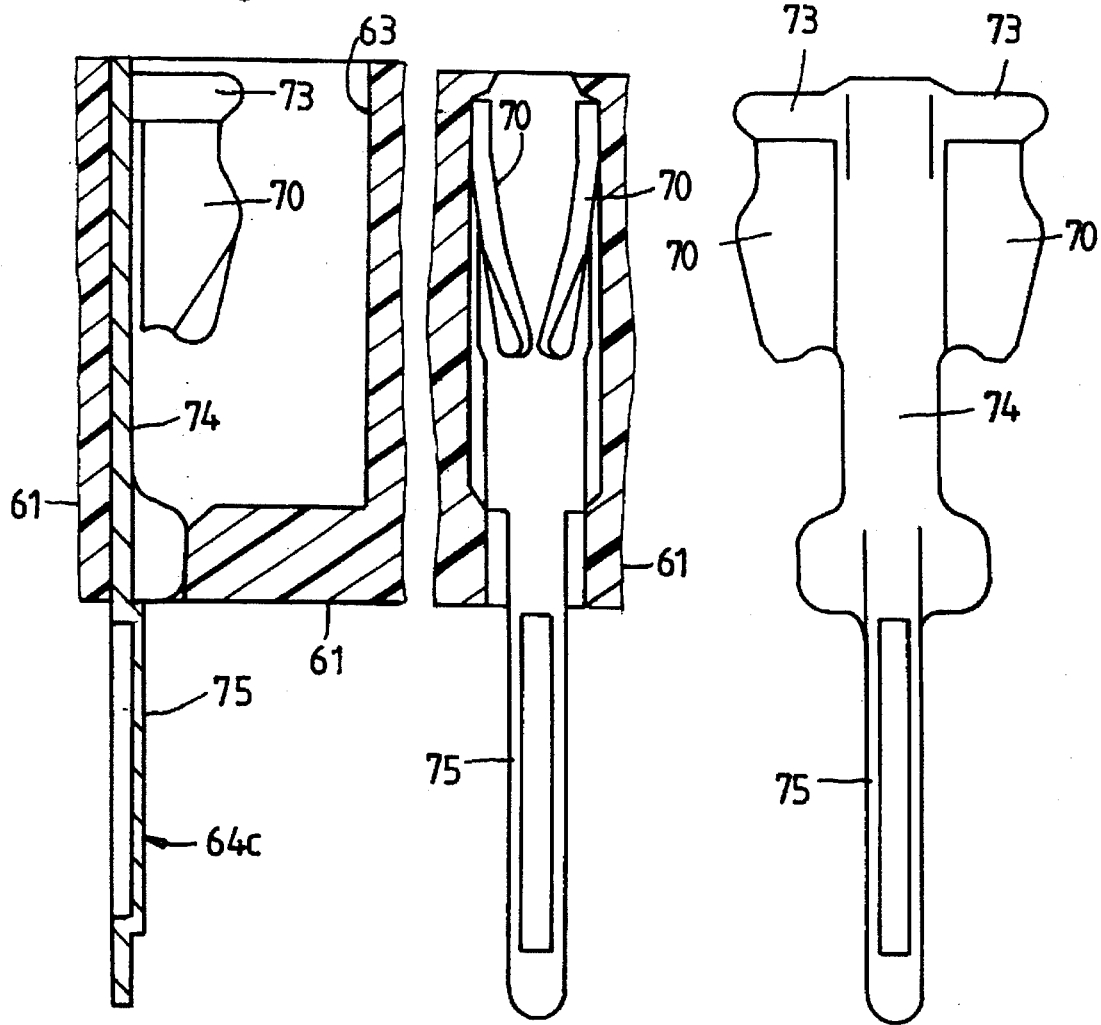
FIG. 38 is a sectional view taken along line 38—38 of FIG. 37.
FIG. 39 is a sectional view taken along line 39—39 of FIG. 37.
FIG. 40 is a right stretched view of the conductive contact of FIG. 39.
Figure 41:
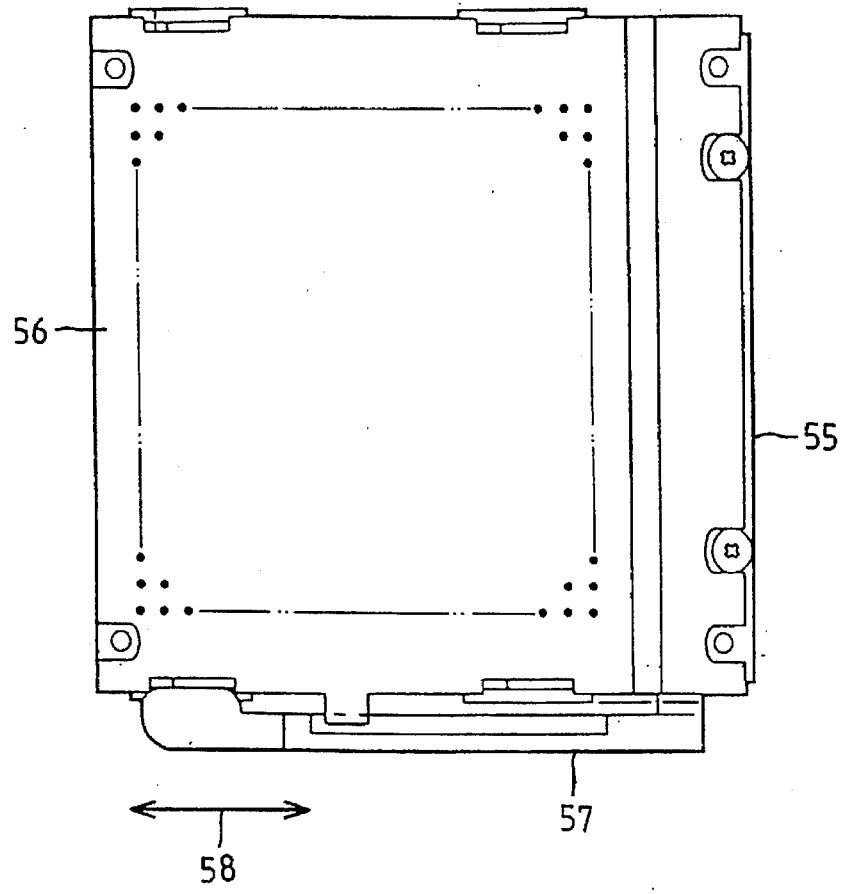
FIG. 41 is a top view of a conventional zero insertion/extraction force socket.
Figure 42:
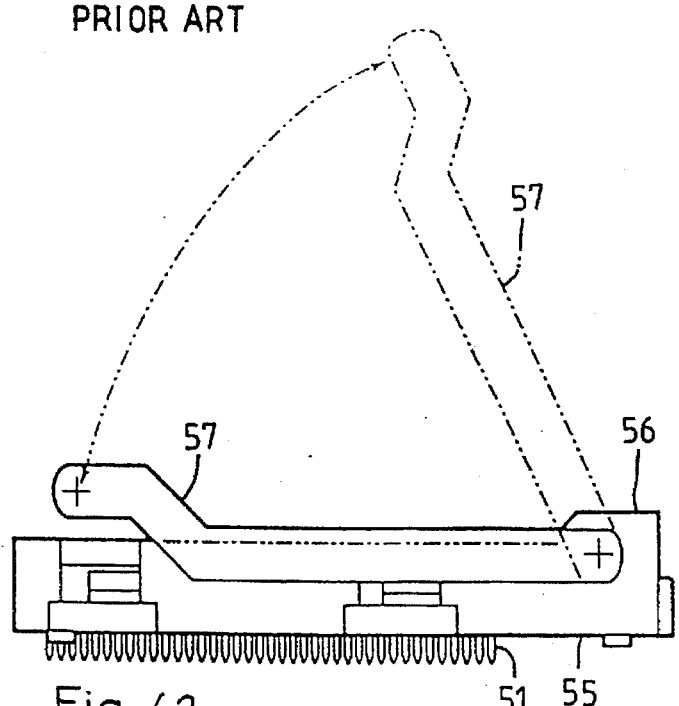
FIG. 42 is a right view of the socket of FIG. 41.

Please refer to FIGS. 3 and 4. When the integrated circuit 67 is inserted into a first embodiment of the socket as shown in FIGS. 1 to 10, the insertion pins 69 of the integrated circuit 67 are positioned right above and aligned with the conductive contacts 64a. That is, the edge of the integrated circuit 67 is aligned with a locating edge 96 of the fulcrum dent 62 and the integrated circuit 67 is downward guided and inserted into a clamping position of the conductive contacts 64a.

The above procedure is only necessary when the CPU of a personal computer is replaced for progression or due to damage. However, the replacement of the CPU for progression is usually made at an interval of several years, while the damage of the CPU is even more rarely seen. Therefore, it is rarely necessary to perform the above procedure.

The conventional zero insertion/extraction force socket is provided with an operation arm for shifting the integrated circuit. However, a plurality of electronic parts are arranged on the integrated circuit around the operation arm. This makes it difficult for a user to extend his/her finger beside the operation arm and pry the same. Therefore, a screwdriver or the like is still necessary for prying the operation arm.

Also, the conventional zero insertion/extraction force socket is designed with the sliding in measure instead of the insertion/extraction measure only for the purpose of overcoming the difficult in extraction of the integrated circuit from the socket. As to the insertion operation, it can be easily accomplished even though the insertion force is not zero. It is focused in the present invention to fully overcome the difficult in extraction of the integrated circuit. The aforesaid fulcrum dent 62 and the pushing member 65 exactly serve to achieve the above purpose.

Please refer to FIGS. 2, 4, 6, 8, 10, 11 and 12. According to a first embodiment of the conductive contact 64a, the contact 64a includes a U-shaped base section 73, four resilient sections 70a, 70b downward extending from the base section 73, a main stem section 74 connected with the base section 73 and an insertion leg section 75 downward extending from the main stem section 74. The base section 73 is attached to a lateral wall of the insertion hole 63 with the resilient sections 70a, 70b downward extending, so that the insertion pin 69 of the integrated circuit 67 can be smoothly slided over the base section 73 and inserted into the resilient sections 70a, 70b and tightly clamped therein.

Please refer to FIGS. 17 to 23. Two resilient sections 70b of the four resilient sections are relatively distal from the main stem section 74 (located at an opening position of the U-shaped base section 73) and serve to clamp and stop the insertion pin 69 from slipping off from the contact 64a and enhance the contacting effect.

Referring to FIGS. 28 to 33, each of two resilient Sections 70a, 70b has a first end 87 and a second end 88, wherein the first end 87 is integrally connected with the base section 73. The width between the first ends 87 of the resilient sections 70a, 70b is defined as the first width W1, while the width between the second ends 88 thereof is defined as the second width W2. The first width W1 is larger than the diameter D or width of the insertion pin 69 of the integrated circuit 67, while the second width W2 is less than the diameter D or width of the insertion pin 69. On lower edge of one or two of the resilient section 70a, 70b is formed a clamping notch 75 dented toward the first end. The width between the two clamping notches of the resilient sections 70a, 70b is defined as the third width W3. The third width W3 is less than the first width W1, while larger than the second width W2. Also, the third width W3 is less than the diameter D or width of the insertion pin 69, so that the insertion pin 69 is more firmly clamped between the clamping notches 75.

Please refer to FIGS. 34 to 40. One or two of the resilient sections 70a have curved concave faces, whereby the width of the exit of the resilient sections 70a near the loosening position is less than the width of the clamping position and thus the insertion pin 69 is even more firmly clamped.

According to the above arrangements, the present invention has the following advantages:

1. The volume of the zero extraction force socket is more minimized to meet the requirement of lightweight, thin, short and small socket product.

2. The conductive contacts can be still easily inserted into or extracted from the insertion holes.

3. The clamping notches, curved concave faces or the resilient sections or the outer resilient sections serve to more firmly clamp the insertion pin of the integrated circuit and thus achieve more reliable contacting effect.

4. The structure of the socket is more simplified and the socket is more easily manufactured and the quality of the product is more easily controlled.

It is to be understood that the above description and drawings are only used for illustrating some embodiments of the present invention, not intended to limit the scope thereof. Any variation and derivation from the above description and drawings should be included in the scope of the present invention.

What is claimed is:

1. A zero extraction force socket adapted to be mounted on a printed circuit board, said socket comprising an insulative housing having:

multiple insertion holes having conductive contacts positioned therein, multiple insertion pins of an integrated circuit being inserted into the insertion holes to contact with the conductive contacts;

a fulcrum dent having a substantially concave contour formed within and located near one edge of the housing, said fulcrum dent forming an opening in an insertion face of said housing for insert and removal therefrom of a pushing piece, the fulcrum dent serving as a leverage fulcrum, enabling the pushing piece when inserted into said opening to push an edge of the integrated circuit and shift the integrated circuit so that the insertion pins of the integrated circuit move from a contacting position where the insertion pins contact with the conductive contacts to a loosening position where the insertion pins do not contact the conductive contacts; and, a pushing member partially disposed in the fulcrum dent and having an insertion section, a resilient section and a pushing section extending above said insertion face, the insertion section of said pushing member being positioned in the fulcrum dent.

2. A socket as claimed in claim 1, wherein the resilient section integrally extends from the insertion section to form a fulcrum concavity for contacting with the pushing piece and provides a leverage fulcrum therefor, the pushing section being integrally connected with an end of the resilient section, said pushing section having a pushing face and an opposed pushed face, the pushing face serving to push the edge of the integrated circuit, said pushed face for contacting the pushing piece inserted in the fulcrum dent and being pushed by the pushing piece.

3. A socket as claimed in claim 2, wherein the fulcrum concavity is U-shaped.

4. A socket as claimed in claim 2, wherein the fulcrum concavity is V-shaped.

5. A socket as claimed in claim 2, wherein the pushing member is made of metal material.

6. A socket as claimed in claim 7, wherein each of the two resilient sections of the conductive contact has a first end and a second end, wherein the first end is integrally connected with the base section and the second end extends toward the insertion leg section of the conductive contact, a width between the first ends of the resilient sections being defined as a first width, while a width between the second ends thereof being defined as a second width, the first width being larger than a diameter or width of the insertion pin of the integrated circuit, while the second width being less than the diameter or width of the insertion pin, on lower edge of one or two of the resilient section being formed a clamping notch dented toward the first end, a width between the two clamping notches of the resilient sections being defined as a third width, the third width being less than the first width, while larger than the second width, the third width being also less than the diameter or width of the insertion pin, so that the insertion pin is more firmly clamped between the clamping notches.

7. A socket as claimed in claim 1, wherein the conductive contact includes a U-shaped base section, at least two resilient sections extending downwardly from the base section, a main stem section connected with the base section and an insertion leg section extending downwardly from the main stem section, the base section being attached to a lateral wall of the insertion hole with the resilient sections extending downwardly from lower edges of two sides of the base section, so that the insertion pin of the integrated circuit can be smoothly slid over the base section and tightly clamped in the resilient sections.

8. A socket as claimed in claim 7, wherein at least one of the resilient sections has a curved concave face for more firmly clamp the insertion pin of the integrated circuit.

9. A socket as claimed in claim 7, wherein each of the resilient sections of the conductive contact is further cut into at least two resilient sections, two of the four resilient sections being located at an opening position of the U-shaped base section and serving to clamp and stop the insertion pin from slipping off from the conductive contact and enhancing contacting effect.

10. A zero extraction force socket adapted to be mounted on a printed circuit board, said socket comprising an insulative housing having:

multiple insertion holes having conductive contacts positioned therein, multiple insertion pins of an integrated circuit being inserted into the insertion holes to contact with the conductive contacts;

a fulcrum dent having a substantially concave contour formed within and located near one edge of the housing, said fulcrum dent forming an opening in an insertion face of said housing for insert and removal therefrom of a pushing piece, the fulcrum dent serving as a leverage fulcrum, enabling the pushing piece when inserted into said opening to directly push an edge of the integrated circuit and shift the integrated circuit so that the insertion pins of the integrated circuit move from a contacting position where the insertion pins contact with the conductive contacts to a loosening position where the insertion pins do not contact the conductive contacts; and, a metal protective member inserted in the fulcrum dent to form a hard and anti-abrasion surface along a surface of the fulcrum dent.

* * * * *